United States Patent [19]

Mason

[11] 4,010,389
[45] Mar. 1, 1977

[54] SOLID STATE TIME DELAY AND HOLDING CIRCUIT

[75] Inventor: William B. Mason, Arlington, Tex.
[73] Assignee: TECCOR Electronics, Inc., Euless, Tex.
[22] Filed: Nov. 24, 1975
[21] Appl. No.: 634,421
[52] U.S. Cl. .......................... 307/293; 307/252 B; 307/246; 328/129
[51] Int. Cl.² .................... H03K 5/13; H03K 17/60
[58] Field of Search ............... 307/293, 252 B, 246; 328/129, 130, 131

[56] References Cited
UNITED STATES PATENTS

| | | | |
|---|---|---|---|
| 3,597,637 | 8/1971 | Vandemore et al. | 307/252 B |
| 3,745,382 | 7/1973 | Hoge et al. | 307/293 |
| 3,846,648 | 11/1974 | Scott | 307/293 |
| 3,873,853 | 3/1975 | Ahmed | 307/252 B |
| 3,950,657 | 4/1976 | Sheng et al. | 307/252 B |

Primary Examiner—Stanley D. Miller, Jr.
Attorney, Agent, or Firm—Giles C. Clegg, Jr.

[57] ABSTRACT

Circuitry operating as a time delay/holding relay whereby a connection is established between a pair of output terminals whenever power is applied between input terminals and for a timed period after the receipt of a predetermined signal. A first integrated circuit is connected as a free running multivibrator to generate a pulse train for maintaining a bilateral thyristor in its conductive state to close the connection. A second integrated circuit, identical to the first, is utilized to enable the first integrated circuit. The second integrated circuit is connected as a free running multivibrator but oscillations are disabled until the receipt of the predetermined signal. This maintains the enabling signal for the specified time period after the signal is received. External connections of components to the second integrated circuit changes the internal operation of that circuit.

2 Claims, 1 Drawing Figure

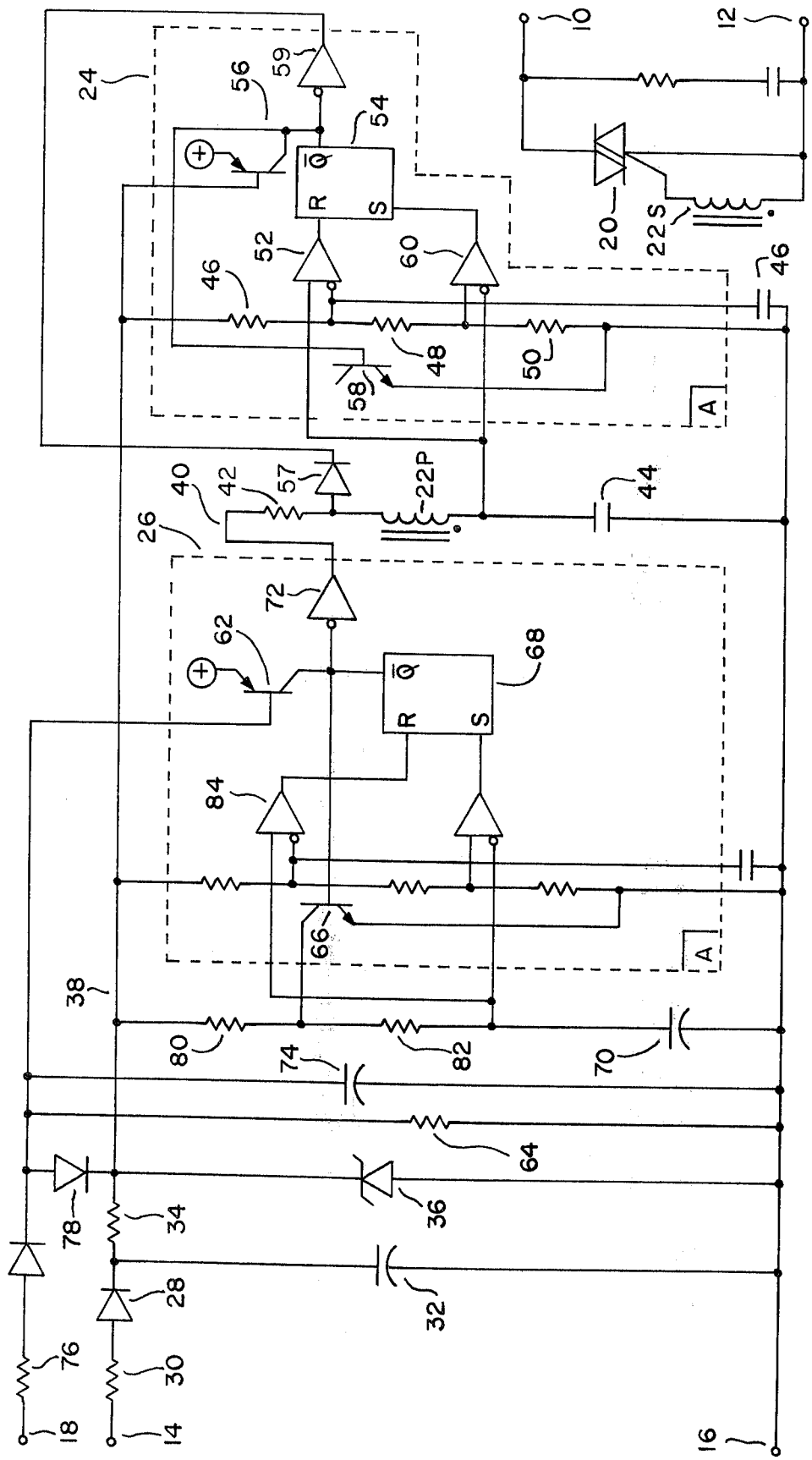

SOLID STATE TIME DELAY AND HOLDING CIRCUIT

BACKGROUND OF THE INVENTION

This invention relates to power control circuitry and, more particularly, to circuitry functioning as a time delay/holding relay for controlling input power to a device of the type requiring a warm-up period prior to operation.

Many electrically powered devices require a warm-up period after being initially turned on in order to become operative. In particular, this applies to electric devices utlizing vacuum tube elements having heater filaments. For example, microwave ovens utilize magnetrons for generating power at microwave frequencies. These magnetrons have heater filaments and require an initial warm-up period. Many times during the use of such a device, it is turned off momentarily only to be turned on again immediately thereafter. For example, when cooking using a microwave oven, a first dish may be cooked, the oven turned off for removal thereof and a second dish may be placed therein, the oven then being turned on again, with the period during which the oven is turned off being only a matter of seconds. It would be desirable to incorporate in the oven controls a timing device whereby when the oven is turned off, the filaments of the magnetron remain on for a predetermined period, say 60 seconds, so that the oven may be turned on again and made operative without an additional warm-up period. In the past, electromechanical time delay/holding relays have been utilized to perform this function. The use of such relays has not been entirely satisfactory however, electromechanical devices tending to have inherent reliability problems. It is therefore desirable to replace the electromechanical relay with solid state circuitry which is more reliable and trouble free.

SUMMARY OF THE INVENTION

In accordance with the principles illustrative of this invention, solid state circuitry is advantageously provided to replace electromechanical time delay/holding relays. This circuitry utilizes a pair of identical integrated circuits configured to operate as free running multivibrators. A first of these circuits provides a pulse train to turn on a bilateral thyristor to complete a path to the filament to be controlled. The other integrated circuit is configured like the first but its output it utilized to enable the first circuit. External connections to the second integrated circuit change the internal operation of the circuit and disable the oscillations until the receipt of a predetermined signal. Upon this receipt, a timing function is initiated at the conclusion of which time period the first circuit is disabled to terminate the pulse generation and open the connection.

DESCRIPTION OF THE DRAWING

The foregoing will be more readily apparent upon reading the following description in conjunction with the drawing in which the single FIGURE depicts a schematic diagram of illustrative circuitry embodying the principles of this invention.

DESCRIPTION OF THE PREFERRED EMBODIMENT

Referring now to the drawing, depicted therein is illustrative circuitry embodying the principles of this invention and adapted to provide a connection across terminals 10 and 12 connected to supply power to the heater filament path of a magnetron tube utilized in a microwave oven. Application of standard wall power, i.e. 120 volts at 60 cycles, to terminals 14 and 16 results in the closure of the paths between terminals 10 and 12. An external connection of terminal 18 to terminal 14 begins a timing period which is suitably 60 seconds. At the termination of this timing period, the connection between terminals 10 and 12 is opened. If power between terminals 14 and 16 is not removed, the connection between terminals 10 and 12 will be re-established within a preset time interval. If at the conclusion of the timing period power is removed from terminals 14 and 16, the circuit will reset to its initial mode of operation within a preset time interval.

To perform the aforedescribed function there is provided a thyristor 20 to close the connection between terminals 10 and 12 upon the application of a control signal to its control terminal from the secondary winding 22S of the pulse transformer comprised of primary winding 22P and secondary winding 22S when power is supplied to terminals 14 and 16. Primary winding 22P is connected to be pulsed by integrated circuit 24, connected as a free running, or astable, multivibrator. Integrated circuit 24 is identical to integrated circuit 26, as denoted by the letter A in the lower left corners thereof. These integrated circuits are illustratively of the type denoted XR-2556 manufactured by Exar Integrated Systems Incorporated, Sunnyvale, California. The XR-2556 integrated circuit package contains two independent 555-type timers on a single chip. The construction and operation of such circuits is well known in the art. Each timer section is independent of the other and has separate output and control terminals. The timer sections can be operated in monostable modes of operation or astable modes of operation, with frequency and timing being controlled by the values of external resistors and capacitors such as capacitor 70 and resistors 80 and 82 connected to circuit 26. In the preferred embodiment, both circuits 24 and 26 are connected as free running multivibrators with circuit 26 providing an enabling signal for the operation of circuit 24. In accordance with a novel aspect of this invention, circuit 26, while being connected as a free running multivibrator, is disabled from oscillating until terminal 18 is connected to terminal 14. At this time, circuit 26 will begin its oscillation but the time period of oscillation is chosen so that circuit 26 continues enabling circuit 24 for 60 seconds after the connection of terminal 18 to terminal 14.

The 120 volt AC power applied to terminals 14 and 16 is rectified, filtered and regulated by diode 28, resistor 30, capacitor 32, resistor 34 and zener diode 36 to provide a relatively smooth 12 volt DC power source on line 38. Assuming for the time being that circuit 26 provides a nearly 12 volt signal at its output on line 40, resistor 42, primary winding 22P, rectifier 57, capacitors 44 and 46 and circuit 24 act to generate a train of pulses which switch thyristor 20 into a conductive state. This train of pulses is generated in the following manner.

With a 12 volt level on line 40, capacitor 44 starts to charge through resistor 42 and primary winding 22P. Internal to circuit 24, resistors 46, 48 and 50 are of equal value and form a voltage divider so that when the voltage on capacitor 44 reaches two-thirds of the voltage on line 38, or about 8 volts, comparator 52 causes flip-flop 54 to be reset. When flip-flop 54 is reset, the voltage at the $\overline{Q}$ output of flip-flop 54 goes high on line 56, causing output amplifier 59 to conduct and sink current forming a discharge path or capacitor 44 through diode 57. When the voltage across capacitor 44 drops to one-third the voltage on line 38, or about 4 volts comparator 60 provides a signal to cause flip-flop 54 to set, lowering the signal level on line 56 and turning off amplifier 59, thus ending the discharge of capacitor 44. Capacitor 44 then starts to charge again and when it reaches 8 volts it discharges, the cycle repeating itself so long as high signals are present on line 40 and line 38. It is thus seen that the charge on capacitor 44 oscillates between approximately 4 volts and 8 volts. The charging and discharging of capacitor 44 through primary winding 22P induces a train of pulses in secondary winding 22S, keeping thyristor 20 in a conductive state when potential is present across terminals 10 and 12.

Without any power applied to terminal 18, the base of reset transistor 62 in integrated circuit 26 is connected to the supply return through resistor 64. Resistor 64 is chosen to have a relatively large value, for reasons which will become apparent from the following discussion. This connection of transistor 62 allows transistor 62 to conduct sufficiently to turn on discharge transistor 56 but the conduction of transistor 62 is not sufficient to reset flip-flop 68. The conduction of transistor 66 prevents capacitor 70 from charging, thereby maintaining the $\overline{Q}$ output of flip-flop 68 at a low level and providing a high signal on line 40 through inverting output amplifier 72.

When power is applied to terminal 18, capacitor 74 is charged through resistor 76 and is clamped to the 12 volt supply voltage by diode 78. The presence of 12 volts at the base of transistor 62 causes transistor 62 to turn off, placing discharge transistor 66 into its nonconductive state and with the output of amplifier 72 remaining high for the purpose of charging capacitor 44. Circuit 26 is then conditioned to operate as a free running multivibrator. This allows capacitor 70 to charge through resistors 80 and 82. When capacitor 70 charges to approximately two thirds the voltage on line 38, about 8 volts, comparator 84 provides a signal to reset flip-flop 68, sourcing current to the base of discharge transistor 66 and switching it into a conductive state, thereby discharging capacitor 70. At the same time, the output of amplifier 72 applied to line 40 changes to a low level, depriving capacitor 44 of its charging source and terminating the generation of the pulse train which kept thyristor 20 in the conductive state. In accordance with one specific example of the invention, the value of resistors 80 and 82 and capacitor 70 are chosen so that it takes approximately 60 seconds after power is applied to terminal 18 for capacitor 70 to charge to the threshold voltage of approximately 8 volts necessary to change the state of circuit 26.

It will now be appreciated that the value of resistor 64 is critical. In the normal operation of circuit 26, the connection to the base of reset transistor 62 is for the purpose of resetting flip-flop 68 and causing transistor 66 to conduct. However, the use of resistor 64 advantageously results in transistor 62 conducting sufficiently to cause transistor 66 to conduct but insufficiently to reset flip-flop 68. Thus, although circuit 26 is externally connected as a free running multivibrator, in actuality the oscillations of circuit 26 are inhibited by the use of resistor 64 until power is applied to terminal 18. At that time the oscillations of circuit 26 may proceed. But the choice of component values for resistors 80 and 82 and capacitor 70 are such that circuit 26 acts as a 60 second timer with respect to maintaining the level on output line 40.

It will be appreciated that another important feature of the invention is the use of the 555 type timer to drive a pulse transformer for the purpose of controlling a device such as triac 20, by connecting the primary 22P of the pulse transformer, rather than a resistor, in series with capacitor 44 and resistor 42 and changing the operation of the circuit. Transistor 58 is not utilized as it and the corresponding transistor 66 of timer 26 are internally current limited. In the case of timer 26, resistor 82 limits the current through transistor 66 to an acceptable level. However, if the collector of transistor 58 were connected to the juncture between primary 22P and resistor 42 the transistor 58 could not conduct sufficient current to produce the desired pulse without damage to the circuit. The desired pulse is produced, however, by connecting the juncture between winding 22P and resistor 42 through diode 57 to the output amplifier 59 which provides a current sink permitting a rapid discharge of capacitor 44 through winding 22P and the generation of the desired ouput pulse in winding 22S.

Accordingly, there has been described solid state circuitry which may be substituted for a conventional time delay/holding relay. This circuitry utilizes conventional integrated circuits but the external connections thereto advantageously provide changes in function and operation of the integrated circuits. While the invention has been described with reference to a preferred embodiment, it will be understood by those skilled in the art that various changes may be made and equivalents substituted for elements thereof without departing from the true spirit and scope of the invention, as defined by the appended claims. In addition, many modifications may be made to adapt the invention to a particular situation without departing from its essential teachings.

What is claimed is:

1. Circuitry for establishing a connection between a pair of terminals and for opening said connection a predetermined time interval after receiving a predetermined signal comprising:

switch means including a bilateral thyristor connected across said terminals, said switch means including a control input, said switch means being responsive to an enabling signal applied to said control input for establishing said connection and responsive to the removal of said enabling signal from said control input for opening said connection;

pulse generating means connected to said control input, said pulse generating means having an enabling input and responsive to a signal at a predetermined level at said enabling input for generating said enabling signal, said pulse generating means including a pulse transformer having its secondary winding connected to the control input of said switch means; and timing means for providing said predetermined level signal to said pulse generating means, said timing means including means for receiving said predetermined signal and responsive thereto for removing said predetermined level signal a predetermined time interval after receipt of said predetermined signal, said timing means comprising;

a flip-flop;

a capacitor;

means for charging said capacitor;

discharge means selectively controllable for providing a discharge path for said capacitor;

means for conditioning said flip-flop to a first state when the charge on said capacitor is below a first level;

means for conditioning said flip-flop to a second state when the charge on said capacitor is above a second level, said second level being above said first level;

means responsive to said flip-flop being in said first state for providing said predetermined level signal to said pulse generating means;

means responsive to said flip-flop being in said second state of controlling said discharge means to provide said discharge path; and means controlling said discharge means to provide said discharge path while said flip-flop is in said first state and responsive to receipt of said predetermined signal for controlling said discharge means to open said discharge path and allow said capacitor to charge.

2. Circuitry for establishing a connection between a pair of terminals and for opening said connection a predetermined time interval after receiving a predetermined signal comprising:

switch means including a bilateral thyristor connected across said terminals, said switch means including a control input, said switch means being responsive to an enabling signal applied to said control input for establishing said connection and responsive to the removal of said enabling signal from said control input for opening said connection;

pulse generating means connected to said control input, said pulse generating means having an enabling input and responsive to a signal at a predetermined level at said enabling input for generating said enabling signal, said pulse generating means including a pulse transformer having its secondary winding connected to the control input of said switch means; and timing means for providing said predetermined level signal to said pulse generating means, said timing means including means for receiving said predetermined signal and responsive thereto for removing said predetermined level signal a predetermined time interval after receipt of said predetermined signal, said timing means comprising;

a free running multivibrator circuit having a reset terminal connected to a reset transistor which resets a flip-flop and causes a discharge transistor to conduct when a low signal is applied to said reset terminal; and a high value resistor connected at one end to the circuitry power supply return and at the other end to said reset terminal and said predetermined signal receiving means;

whereby prior to receipt of said predetermined signal the reset transistor conducts sufficiently to cause the discharge transistor to conduct without resetting the flip-flop.

* * * * *